(12) United States Patent
Kwon et al.

(10) Patent No.: US 9,500,696 B2
(45) Date of Patent: Nov. 22, 2016

(54) TEST CIRCUIT FOR THYRISTOR VALVE IN HVDC SYSTEM

(71) Applicant: LSIS CO., LTD., Anyang-si, Gyeonggi-do (KR)

(72) Inventors: Jun Bum Kwon, Seoul (KR); Teag Sun Jung, Seoul (KR); Seung Taek Baek, Anyang-si (KR); Wook Hwa Lee, Incheon (KR); Yong Ho Chung, Ansan-si (KR)

(73) Assignee: LSIS CO., LTD., Anyang-si (KR)

( * ) Notice: Subject to any disclaimer, the term of this patent is extended or adjusted under 35 U.S.C. 154(b) by 186 days.

(21) Appl. No.: 14/323,837

(22) Filed: Jul. 3, 2014

(65) Prior Publication Data

US 2015/0102834 A1 Apr. 16, 2015

(30) Foreign Application Priority Data

Oct. 16, 2013 (KR) .......................... 10-2013-0123623

(51) Int. Cl.
*G01R 31/26* (2014.01)
*H02J 3/36* (2006.01)

(52) U.S. Cl.
CPC .............. *G01R 31/263* (2013.01); *H02J 3/36* (2013.01)

(58) Field of Classification Search
CPC G01R 31/263; G01R 31/3272; G01R 19/00; G01R 19/2513; G01R 21/06; G01R 31/00; G01R 31/14; G01R 31/31924; G01R 31/3336; G01R 31/40; G01R 31/3271; H03K 17/0824; H03K 17/08144; H03K 17/105; H03K 17/725; H03K 17/125; H02M 7/483; H02M 7/497; H02M 7/521; H02J 3/36
See application file for complete search history.

(56) References Cited

U.S. PATENT DOCUMENTS 4,648,018 A * 3/1987 Neupauer ................ H02J 3/36
363/35

(Continued)

FOREIGN PATENT DOCUMENTS

| EP | 1362242 | 11/2003 | |
|---|---|---|---|
| KR | 10-2012-0109379 | 10/2012 | |
| WO | WO 02/067003 | * 8/2002 | .......... G01R 31/333 |
| WO | 2012/071774 | 6/2012 | |

OTHER PUBLICATIONS

Sheng, et al., "Operational Tests of the Three-Gorges—Changzhou HVDC Thyristor Valves by Using a Synthetic Test Circuit," ICPS2001 Conference on Sep. 3-5, 2001, IEEE, 5 pages.

(Continued)

*Primary Examiner* — Vinh Nguyen
(74) *Attorney, Agent, or Firm* — Lee Hong Degerman Kang & Waimey

(57) ABSTRACT

Provided is a synthetic test circuit for synthetic-testing a thyristor valve in high voltage direct current (HVDC). A resonant circuit applies forward DC current, a reverse DC voltage, and a forward DC voltage to synthetic-test the thyristor valve. A current generation unit generates DC current that is above a reference current value to supply the generated DC current into the resonant circuit. A voltage generates unit generating a DC voltage that is above a reference voltage value to supply the generated DC voltage into the resonant circuit. The resonant circuit includes a charging auxiliary valve for charging a gate driver of the thyristor valve.

8 Claims, 5 Drawing Sheets

(56) References Cited

U.S. PATENT DOCUMENTS

| | | | | |
|---|---|---|---|---|
| 5,521,526 A | * | 5/1996 | Nyberg | G01R 31/263 324/762.01 |
| 2011/0242855 A1 | | 10/2011 | Jovcic | |
| 2011/0273201 A1 | * | 11/2011 | He | G01R 31/3272 324/762.01 |
| 2013/0193998 A1 | * | 8/2013 | Tang | G01R 31/14 324/764.01 |

OTHER PUBLICATIONS

Kim, et al., "A New Synthetic Test Circuit for Testing Thyristor Valve in HVDC Converter," The Transactions of the Korean Institute of Power Electronics, vol. 17, No. 3, Jun. 2012, pp. 191-197.

Korean Intellectual Property Office Application Serial No. 10-2013-0123623, Notice of Allowance dated Aug. 22, 2014, 3 pages.

\* cited by examiner

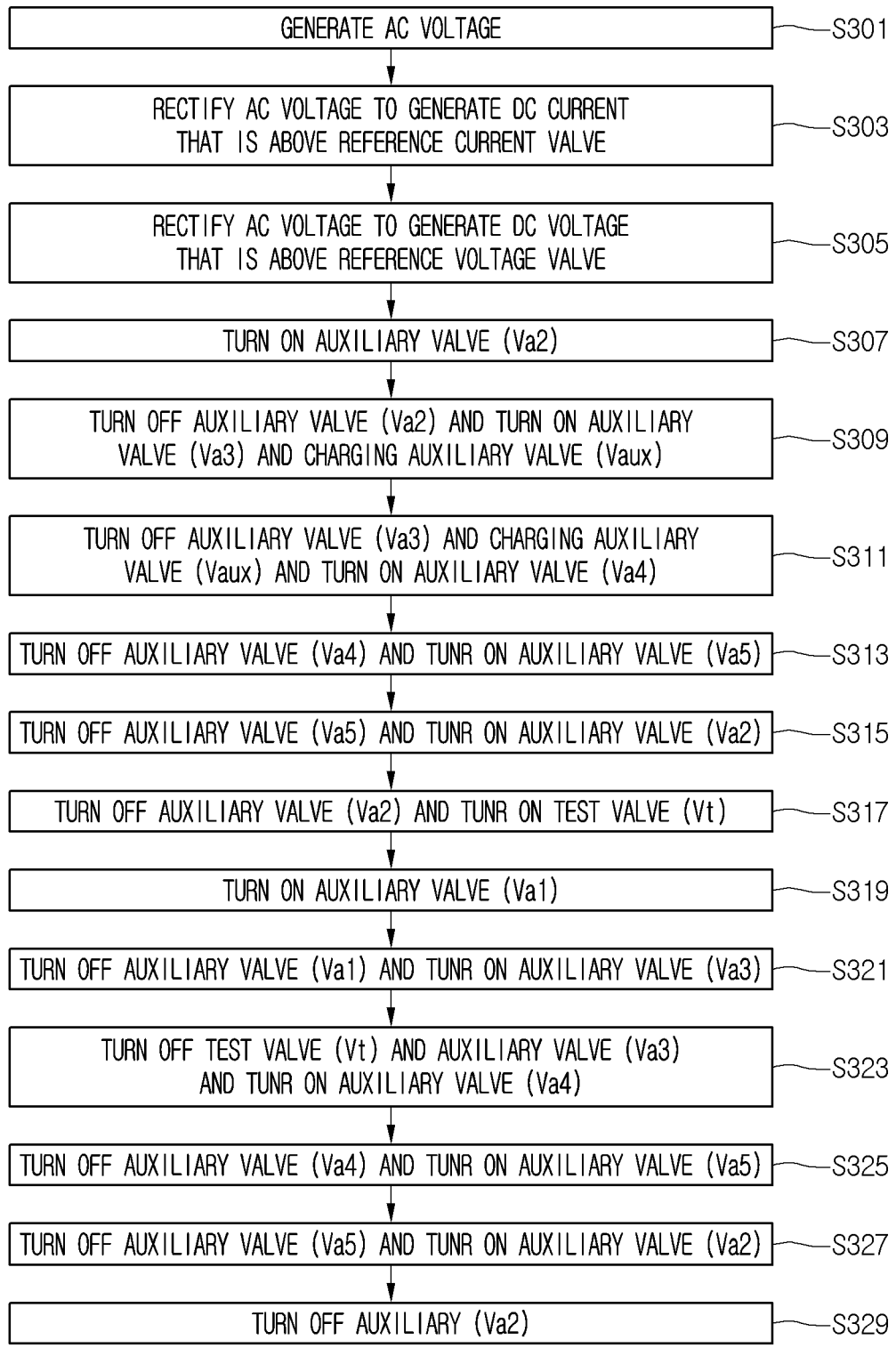

TEST CIRCUIT FOR THYRISTOR VALVE IN HVDC SYSTEM

CROSS-REFERENCE TO RELATED APPLICATIONS

Pursuant to 35 U.S.C. §119(a), this application claims the benefit of earlier filing date and right of priority to Korean Patent Application No. 10-2013-0123623, filed on Oct. 16, 2013, the contents of which are all hereby incorporated by reference herein in its entirety.

BACKGROUND

The present disclosure relates to a synthetic test circuit for testing a thyristor valve in a high voltage direct current (HVDC) system.

High voltage direct current (HVDC) transmission is one of electricity transmission methods. According to the HVDC transmission, a high voltage AC power generated in a power plant is converted into a high voltage DC power having relatively high efficiency by using a power inverter to transmit the high voltage DC power. Thereafter, the transmitted high voltage DC power is converted again into the AC power by the power inverter to transmit the AC power. The HVDC transmission may have an advantage in long-distance transmission because of relatively low power consumption.

The power inverter used for the HVDC transmission may be divided into a thyristor-based current source inverter and an insulated gate bipolar mode transistor (IGBT)-based voltage source inverter according to a shape of a valve. The current source inverter is being commonly used from the 1980s until now. On the other hand, the voltage source inverter became commercialized in the early 2000s. Thereafter, although the voltage source inverter continuously increases in capacity, the capacity of the voltage source inverter is still less than that of the current source inverter. Thus, the voltage source inverter is being mainly utilized for connecting a large scale offshore wind power plant to an AC power grid.

In the HVDC transmission, one of the most important factors is an AC-DC and DC-AC power inverter. Since the power inverter has a very high operation voltage, a plurality of thyristors are connected to each other in series to constitute one valve. It is necessary to verify operations of the valves through a voltage and power to be applied when operating before the power inverter is installed. However, to verify the operations of the valves through the voltage and power to be applied when operating, a huge power may be consumed, and security problems may occur.

Thus, an apparatus for simulating the operation voltage and capacity of the power inverter to test the valves is needed. This apparatus is called a synthetic test circuit. The synthetic test circuit includes a current generation unit for supplying forward current to be applied when the valve is turned on and a voltage generation unit for supplying a reverse voltage and forward voltage to be applied when the valve is turned off.

SUMMARY

Embodiments provide a synthetic test circuit that creates an operation environment similar to that of an actual HVDC valve to test the HVDC valve.

In one embodiment, a synthetic test circuit for synthetic-testing a thyristor valve in high voltage direct current (HVDC) includes: a resonant circuit applying forward DC current, a reverse DC voltage, and a forward DC voltage to synthetic-test the thyristor valve; a current generation unit generating DC current that is above a reference current value to supply the generated DC current into the resonant circuit; and a voltage generation unit generating a DC voltage that is above a reference voltage value to supply the generated DC voltage into the resonant circuit, wherein the resonant circuit includes a charging auxiliary valve for charging a gate driver of the thyristor valve.

In another embodiment, a synthetic test circuit for synthetic-testing a thyristor valve in high voltage direct current (HVDC) includes: a current generation unit; a first auxiliary valve having one end connected to one end of the current generation unit; the thyristor valve having one end connected to the other end of the first auxiliary valve and the other end that is grounded; a charging auxiliary valve having one end connected to one end of the thyristor valve and the other end that is grounded; a first capacitor having one end connected to one end of the charging auxiliary valve and the other end that is grounded; a first inductor having one end connected to the one end of the charging auxiliary valve; a second auxiliary valve having one end connected to the other end of the first inductor; a third auxiliary valve having one end connected to the other end of the first inductor; a second capacitor having one end connected to the other end of the second auxiliary valve and the other end of the third auxiliary valve and the other end that is grounded; a second inductor having one end connected to one end of the second capacitor; a fourth auxiliary valve having one end connected to the other end of the second inductor and the other end that is grounded; a fifth auxiliary valve having one end connected to one end of the fourth auxiliary valve; and a voltage generation unit connected to the other end of the fifth auxiliary valve.

The details of one or more embodiments are set forth in the accompanying drawings and the description below. Other features will be apparent from the description and drawings, and from the claims.

BRIEF DESCRIPTION OF THE DRAWINGS

FIG. 5 is a circuit diagram illustrating an operation of a synthetic test circuit according to another embodiment.

DETAILED DESCRIPTION OF THE EMBODIMENTS

Figure 1:
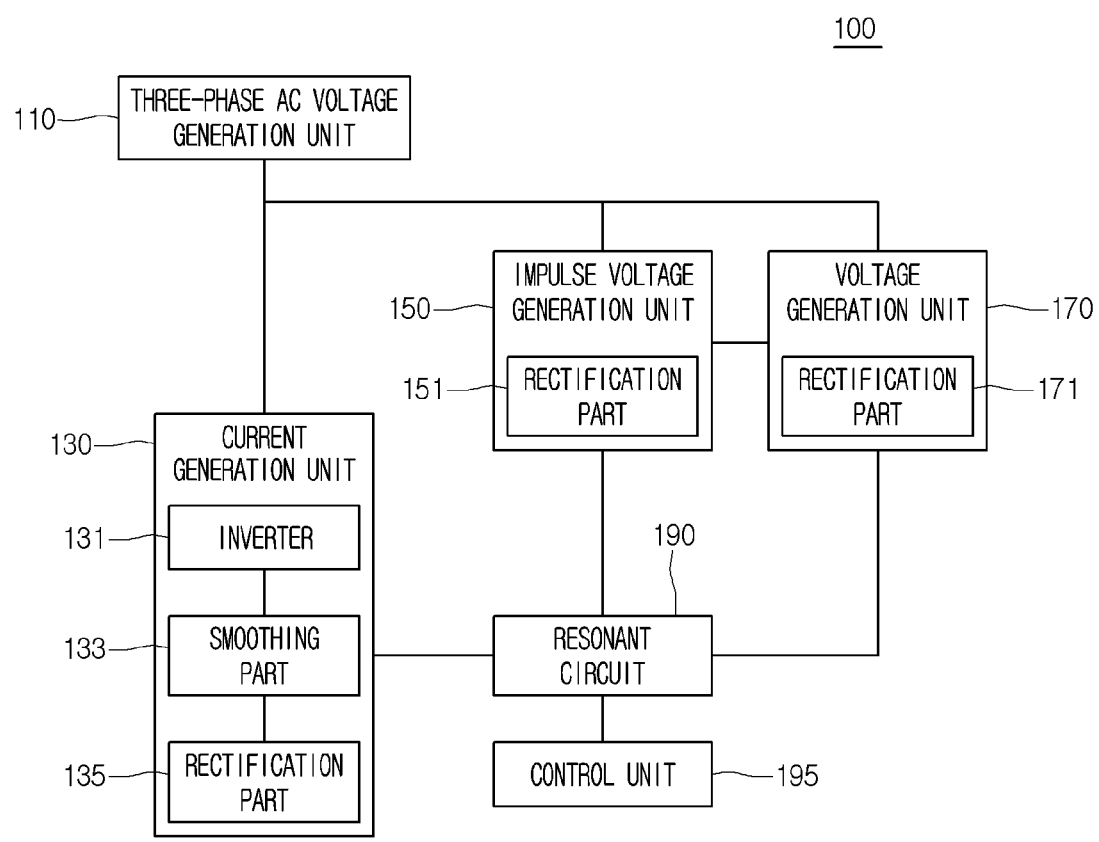
FIG. 1 is a block diagram of a synthetic test circuit according to an embodiment.

Hereinafter, preferred embodiments of the present disclosure will be described in detail with reference to the accompanying drawings in such a manner that the technical idea of the present disclosure may easily be carried out by a person with ordinary skill in the art to which the invention pertains. The present disclosure may, however, be embodied in different forms and should not be construed as limited to the embodiments set forth herein. In the drawings, anything unnecessary for describing the present disclosure will be omitted for clarity, and also like reference numerals in the drawings denote like elements.

Furthermore, when it is described that one comprises (or includes or has) some elements, it should be understood that it may comprise (or include or has) only those elements, or it may comprise (or include or have) other elements as well as those elements if there is no specific limitation.

Hereinafter, a synthetic test circuit according to an embodiment will be described with reference to FIGS. 1 to 3.

FIG. 1 is a block diagram of a synthetic test circuit according to an embodiment. A synthetic test circuit 100 includes a three-phase AC voltage generation unit 110, a current generation unit 130, an impulse voltage generation unit 150, a voltage generation unit 170, a resonant circuit 190, and a control unit 195. The current generation unit 130 includes an inverter 131, a smoothing part 133, and a rectification part 135. The impulse voltage generation unit 150 includes a rectification part 151. The voltage generation unit 170 includes a rectification part 171. The three-phase AC voltage generation unit 110 may generate a three-phase AC voltage to supply the three-phase AC voltage into the current generation unit 130, the impulse voltage generation unit 150, and the voltage generation unit 170.

The current generation unit 130 may generate DC current that is above a predetermined reference current value from the three-phase AC voltage to supply the generated DC current into the resonant circuit 190. Here, the reference current valve may be a current valve required for performing a synthetic test. In a specific embodiment, the reference current valve may be a current valve of about 1,000 A to about 3,000 A. The current generation unit 130 may transform a voltage level to match a rated operating voltage. The rectification part 135 may rectify the AC voltage. The smoothing part 33 may smooth the rectified current. The inverter 131 may invert the smoothed voltage into an AC voltage. Thus, the inverter 131 may generate AC current. The AC current may be combined with current inputted into the inverter 131 to reduce harmonics. As a result, the current generation unit 130 may supply DC current.

The impulse voltage generation unit 150 may generate an impulse voltage from the three-phase AC voltage to supply the impulse voltage into the resonant circuit. The rectification part 151 may rectify the three-phase AC voltage into a DC voltage, and a capacitor provided in the impulse voltage generation unit 150 may smooth the rectified DC voltage to generate a DC voltage. A discharge gap may generate the impulse voltage by using the DC voltage.

The voltage generation unit 170 may generate a DC voltage that is above a predetermined reference voltage value from the three-phase AC voltage to supply the generated DC voltage into the resonant circuit 190. Here, the reference voltage valve may be a voltage valve required for performing the synthetic test. In a specific embodiment, the reference voltage valve may be a voltage valve of about 15 KV to about 30 KV. The rectification part 171 may rectify the three-phase AC voltage into a DC voltage, and a capacitor provided in the voltage generation unit 170 may smooth the rectified DC voltage to generate a DC voltage.

The resonant circuit 190 may apply DC current, a reverse DC voltage, and a forward DC voltage into a test valve that is an object to be synthetic-tested by using a plurality of auxiliary valves provided in the resonant circuit 190.

The control unit 195 may control turn-on/off of the auxiliary valves provided in the resonant circuit and the test valve.

Figure 2:
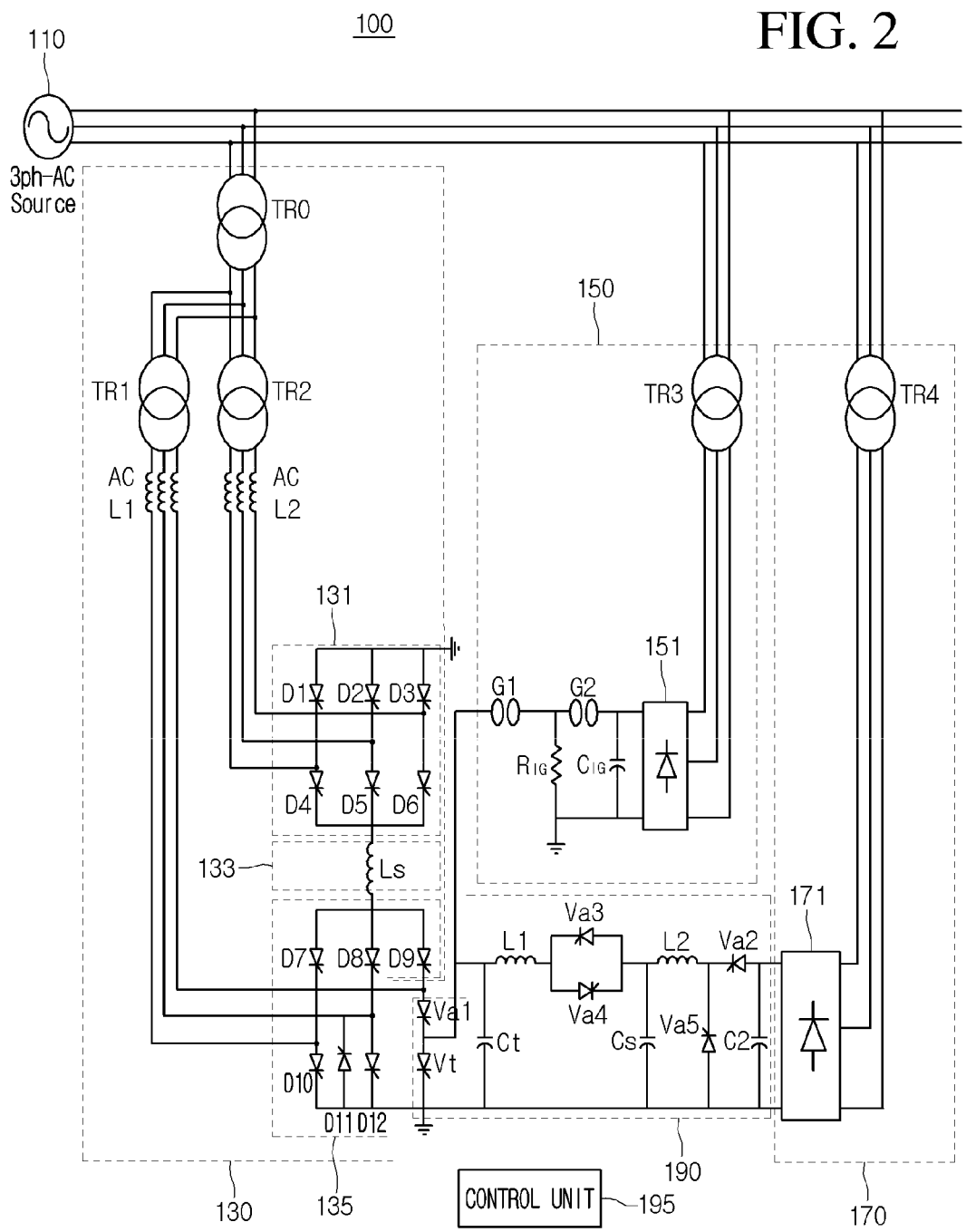
FIG. 2 is a circuit diagram of the synthetic test circuit according to an embodiment.

FIG. 2 is a circuit diagram of the synthetic test circuit according to an embodiment.

The current generation unit 130 may has one end into which the AC voltage is applied by the three-phase AC voltage generation unit 110 and the other end connected to the resonant circuit 190 and the impulse voltage generation unit 150. The current generation unit 130 may be connected as follows. A transformer TR0 has one end into which the AC voltage is applied by the three-phase AC voltage generation unit 110. A transformer TR1 has one end connected to the other end of the transformer TR0. A transformer TR2 has one end connected to the other end of the transformer TR0. A commutation reactance AC L1 has one end connected to the other end of the transformer TR1. A commutation reactance AC L2 has one end connected to the other end of the transformer TR2. The inverter 131 and the rectification part 135 are connected to each other in six-pulse back-to-back connection. Particularly, the inverter 131 and the rectification part 135 may be connected as follows. The inverter 131 has one end connected to the other end of the commutation reactance AC L1. The rectification part 135 has one end connected to the other end of the commutation reactance AC L2. An inductor Ls that is a smoothing part 133 has one end connected to the other end of the inverter 131 and the other end connected to the other end of the rectification part 135. Six thyristors D7, D8, D9, D10, D11, and D12 provided in the inverter 131 may be connected to each other in six-pulse bridge connection. That is, the thyristor D10 has one end that is grounded, and the thyristor D7 has one end connected to the other end of the thyristor D10. The thyristor D11 has one end that is grounded, and the thyristor D8 has one end connected to the other end of the thyristor D11. The thyristor D12 has one end that is grounded, and the thyristor D9 has one end connected to the other end of the thyristor D12. The other ends of the thyristor D7, the thyristor D8, and the thyristor D9 are connected to one of the inductor Ls. Six thyristors D1, D2, D3, D4, D5, and D6 provided in the rectification part 135 may be connected to each other in six-pulse bridge connection. That is, the thyristor D1 has one end that is grounded, and the thyristor D4 has one end connected to the other end of the thyristor D1. The thyristor D1 has one end that is grounded, and the thyristor D4 has one end connected to the other end of the thyristor D1. The other ends of the thyristor D4, the thyristor D5, and the thyristor D6 are connected to the other end of the inductor Ls.

The impulse voltage generation unit 150 may has one end into which the AC voltage is applied by the three-phase AC voltage generation unit 110 and the other end connected to the resonant circuit 190 and the inverter 131. The impulse voltage generation unit 150 may be connected as follows. A transformer TR3 has one end into which the AC voltage is applied by the three-phase AC voltage generation unit 110. The rectification part 151 has one end connected to the other end of the transformer TR3. A capacitor CIG has one end connected to the other end of the rectification part 151 and the other end that is grounded. A discharge gap G2 has one end connected to the other end of the capacitor CIG. A resistor RIG has one end connected to the other end of the discharge gap G2 and the other end that is grounded. The discharge gap G1 has one end connected to the other end of a discharge gap G2 and one end of the resistor RIG and the other end connected to one end of an auxiliary valve Va1 of the resonant circuit 190.

The voltage generation unit 170 has one end into which the AC voltage is applied by the three-phase AC voltage generation unit 110 and the other end connected to the resonant circuit 190. The voltage generation unit 170 may be connected as follows. A transformer TR4 has one end into which the AC voltage is applied by the three-phase AC voltage generation unit 110. The rectification part 171 has one end connected to the other end of the transformer TR4 and the other end connected to an auxiliary valve Va2 of the resonant circuit 190. A capacitor C2 has one end connected to the other end of the auxiliary valve Va2 and the other end that is grounded.

The resonant circuit 190 has one end connected to the inverter 131 and the other end connected to the voltage generation unit 170. Particularly, the resonant circuit 190 may be connected as follows. The auxiliary valve Va1 has one end connected to the inverter 131. A test valve Vt has one end connected to the other end of the auxiliary valve Va1 and the other end that is grounded. A capacitor Ct has one end connected to one end of the test valve Vt and the other that is grounded. An inductor L1 has one end connected to one end of the capacitor Ct. An auxiliary valve Va3 has one end connected to the other end of the inductor L1. An auxiliary valve Va4 has one end connected to the other end of the inductor L1. A capacitor Cs has one end connected to the other ends of the auxiliary valves Va3 and Va4 and the other end that is grounded. An inductor L2 has one end connected to one end of the capacitor Cs. An auxiliary valve Va5 has one end connected to the other end of the inductor L2 and the other end that is grounded. The auxiliary valve Va2 has one end connected to the other end of an auxiliary valve Va5.

The test valve Vt may be a HVDC valve that is an object to be synthetic-tested. The capacitor Ct may simulate parasitic capacitance that affects the test valve Vt when the test valve Vt operates in an actual power inverter. The auxiliary valve Va1 applies current into the test valve Vt. The auxiliary valve Va2 compensates a lost voltage of the capacitor Cs. The auxiliary valve Va3, the auxiliary valve Va4, the auxiliary valve Va5, the inductor L1, and the inductor L2 may change a path of the current. A specific operation of the resonant circuit 190 according to an embodiment will be described in detail with reference to FIG. 3.

Figure 3:
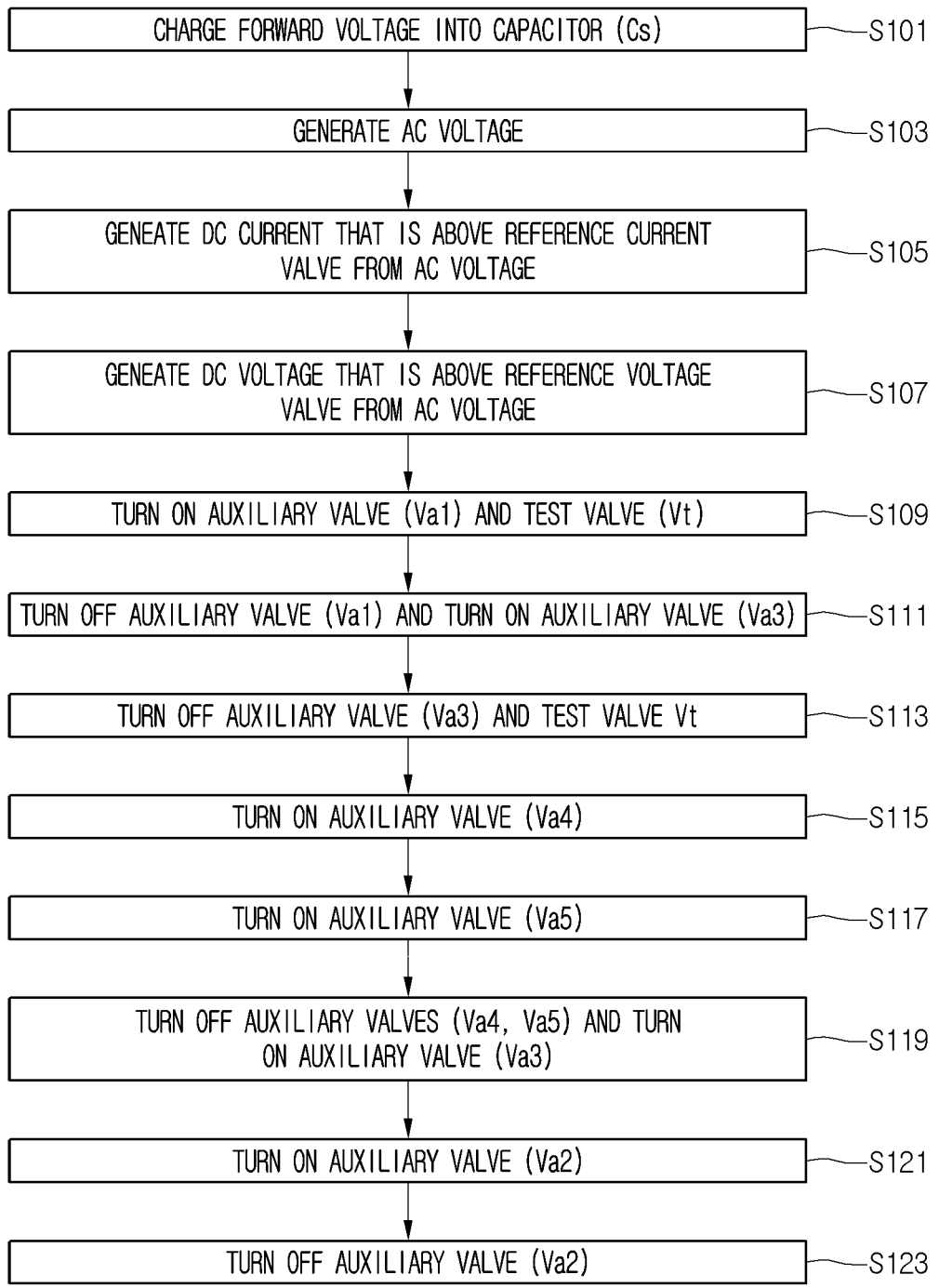
FIG. 3 is a flowchart illustrating an operation of the synthetic test circuit according to an embodiment.

FIG. 3 is a flowchart illustrating an operation of the synthetic test circuit according to an embodiment.

In operation S101, a control unit 195 charges one end of a capacitor Cs connected to auxiliary valves Va3 and Va4 so that the one end of the capacitor Ca has positive (+) polarity and charges the other end of the capacitor Cs that is grounded so that the other end of the capacitor Cs has negative (−) polarity.

In operation S102, a three-phase AC voltage generation unit 110 generates an AC voltage.

In operation S103, a current generation unit 130 generates DC current that is above a reference current valve from the AC voltage. Particularly, transformers TR1 and TR2 boost the AC voltage. A rectification part 135 rectifies the AC voltage. An inverter 131 may invert the rectified voltage into a DC voltage to supply current having predetermined intensity.

In operation S105, a voltage generation unit 170 generates a DC voltage that is above a reference voltage valve from the AC voltage. Particularly, a transformer TR3 boosts the AC voltage. A rectification part 171 rectifies the AC voltage into a DC voltage, and a capacitor C2 smoothes the DC voltage to generate a smoothed DC voltage.

In operation S107, the control unit 195 turns on an auxiliary valve Va1 and a test valve Vt. The control unit 195 turns on the auxiliary valve Va1 and the test valve Vt to apply the DC current generated by the current generation unit 130 into the test valve Vt. Thus, the control 195 tests whether the test valve Vt normally operates when the DC current that is above the reference current valve is applied to the test valve Vt.

In operation S109, the control unit 195 turns on the auxiliary valve Va1 and turns off an auxiliary valve Va3. The control unit 195 turns off the auxiliary valve Va1 and turns on the auxiliary valve Va3 to form a current path connecting the capacitor Cs, the auxiliary valve Va3, the inductor L1, and the test valve Vt to each other. Thus, the control unit 195 applies the voltage charged in the capacitor Cs into the test valve Vt. That is, the control unit 195 applies a negative voltage to one end of the test valve Vt connected to one end of the inductor L1 and a positive voltage to the other end of the test valve Vt. Hereinafter, when the one end of the test valve Vt has the positive polarity, and the other end of the test valve Vt has the negative polarity, the applied voltage may be referred to as a forward voltage. On the other hand, when the one end of the test valve Vt has the negative polarity, and the other end of the test valve Vt has the positive polarity, the applied voltage may be referred to as a reverse voltage. Thus, the control 195 tests whether the test valve Vt normally operates when the reverse voltage is applied to the test valve Vt. The current may be resonant along the current path connecting the capacitor Cs, the auxiliary valve Va3, the inductor L1, and the test valve Vt to each other. Thus, the capacitor Cs may be changed in polarity. That is, the capacitor Cs may be changed in polarity so that the one end of the capacitor Cs has the negative polarity, and the other end of the capacitor Cs has the positive polarity.

In operation S111, the control unit 195 turns off the auxiliary valve Va3 and the test valve Vt. The control unit 195 turns off the auxiliary valve Va3 and the test valve Vt to block the current within a resonant circuit.

In operation S113, the control unit 195 turns on an auxiliary valve Va4. The control unit 195 turns on the auxiliary valve Va4 to apply the voltage charged in the capacitor Cs into the test valve Vt. That is, the control unit 195 applies a negative voltage to one end of the test valve Vt connected to one end of the inductor L1 and a positive voltage to the other end of the test valve Vt. Hereinafter, when the one end of the test valve Vt has the positive polarity, and the other end of the test valve Vt has the negative polarity, the applied voltage may be referred to as a forward voltage. On the other hand, when the one end of the test valve Vt has the negative polarity, and the other end of the test valve Vt has the positive polarity, the applied voltage may be referred to as a reverse voltage. Thus, the control 195 tests whether the test valve Vt normally operates when the reverse voltage is applied to the test valve Vt.

In operation S115, the control unit 195 turns on an auxiliary valve Va5. The control unit 195 turns off the auxiliary valve Va5 to form a current path connecting the capacitor Cs, the auxiliary valve Va5, and the inductor L2 to each other. The current may be resonant along the current path connecting the capacitor Cs, the auxiliary valve Va5, and the inductor L2 to each other. Thus, the capacitor Cs may be changed in polarity. That is, the capacitor Cs may be changed in polarity so that the one end of the capacitor Cs has the positive polarity, and the other end of the capacitor Cs has the negative polarity.

In operation S117, the control unit 195 turns off the auxiliary valves Va4 and Va5 and turns on the auxiliary valve Va3. The control unit 195 turns off the auxiliary valves Va4 and Va5 and turns on the auxiliary valve Va3 to apply the voltage charged in the capacitor Cs into the test valve Vt. That is, the control unit 195 applies the forward voltage into the test valve Vt. Thus, the control 195 tests whether the test valve Vt normally operates when the forward voltage is applied to the test valve Vt.

In operation S119, the control unit 195 turns on an auxiliary valve Va2. Since resistant components exist in abnormal actual devices, the voltage applied into the capacitor Cs may be reduced into its initial state as a time elapses. The control unit 195 turns on the auxiliary valve Va2 to charge the voltage generated by the voltage generation unit 170 to the capacitor Cs.

In operation S121, the control unit 195 turns on the auxiliary valve Va2. In operation S123, when the capacitor Cs is fully charged, the control unit 195 turns off the auxiliary valve Va2 to stop the charging of the capacitor Cs. When the capacitor Cs is fully charged, the process returns to the operation S107, in which the auxiliary valve Va1 and the test valve Vt are turned on, and then the control unit 195 may perform again the synthetic test with respect to the test valve Vt.

The test valve Vt of the synthetic test circuit 100 according to an embodiment may operate only when a gate driver of the test valve Vt is charged. The synthetic test circuit 100 according to an embodiment may operate when the control unit 195 turns on the auxiliary valve Va1 and the test valve Vt. Thus, the current generation unit 130 of the synthetic test circuit 100 according to an embodiment has to supply a sufficient voltage so that the gate driver of the test valve Vt is charged to turn on the test valve Vt. As a result, the current generation unit 130 should have the same rated voltage and current as those of the test valve Vt. Also, each of the transformers TR0, TR1, and TR2 provided in the current generation unit 130 should have sufficient capacitance to satisfy the rated voltage and current of the test valve Vt. Since the test valve Vt is used in the power inverter, the test valve Vt may have large rated voltage and current. The current generation unit 130 of the synthetic test circuit 100 according to an embodiment has to generate power having high current and voltage intensities. As the rated voltage of the current generation unit 130 increases, an installation area and cost may increase, and a control operation for the synthetic test circuit 100 may be completed. To solve the above-described limitations, a synthetic test circuit that is capable of reducing the rated voltage of the current generation unit 130 is needed.

Figure 4:
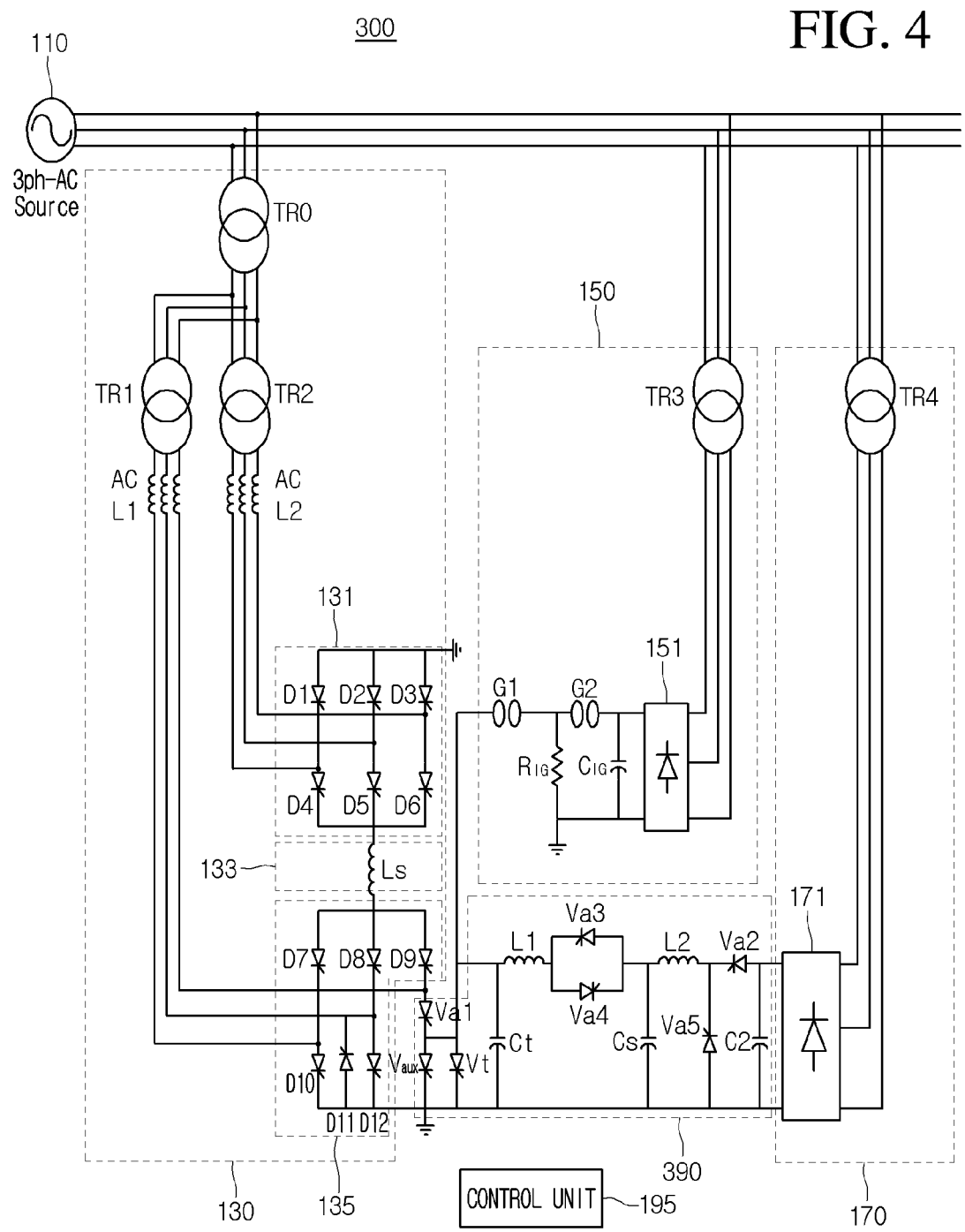
FIG. 4 is a circuit diagram of a synthetic test circuit according to another embodiment.

FIG. 4 is a circuit diagram of a synthetic test circuit according to another embodiment.

A synthetic test circuit 300 according to another embodiment is the same as that 100 according to the foregoing embodiment except for a resonant circuit 390.

The resonant circuit 390 has one end connected to an inverter 131 and the other end connected to a voltage generation unit 170. Particularly, the resonant circuit 390 may be connected as follows. An auxiliary valve Va1 has one end connected to the inverter 131. A test valve Vt has one end connected to the other end of the auxiliary valve Va1 and the other end that is grounded. A charging auxiliary valve Vaux has one end connected to the other end of the auxiliary valve Va1 and the other end that is grounded. A capacitor Ct has one end connected to one end of a test valve Vt and the other that is grounded. An inductor L1 has one end connected to one end of the capacitor Ct. An auxiliary valve Va3 has one end connected to the other end of the inductor L1. An auxiliary valve Va4 has one end connected to the other end of the inductor L1. A capacitor Cs has one end connected to the other ends of auxiliary valves Va3 and Va4 and the other end that is grounded. An inductor L2 has one end connected to one end of the capacitor Cs. An auxiliary valve Va5 has one end connected to the other end of the inductor L2 and the other end that is grounded. An auxiliary valve Va2 has one end connected to the other end of an auxiliary valve Va5.

The charging auxiliary valve Vaux is turned on to charge a gate driver of the test valve Vt. A specific operation of the resonant circuit 190 according to an embodiment will be described in detail with reference to FIG. 3.

FIG. 5 is a circuit diagram illustrating an operation of a synthetic test circuit according to another embodiment.

In operation S301, a three-phase AC voltage generation unit 110 generates an AC voltage.

In operation S303, a current generation unit 130 generates DC current that is above a reference current valve from the AC voltage. Particularly, transformers TR1 and TR2 boost the AC voltage. A rectification part 135 rectifies the AC voltage. An inverter 131 may invert the rectified voltage into a DC voltage to supply current having predetermined intensity.

In operation S305, a voltage generation unit 170 generates a DC voltage that is above a reference voltage valve from the AC voltage. Particularly, a transformer TR3 boosts the AC voltage. A rectification part 171 rectifies the AC voltage into a DC voltage, and a capacitor C2 smoothes the DC voltage to generate a smoothed DC voltage.

A control unit 195 charges a gate driver of a test valve Vt through following operations.

In operation S307, the control unit 195 turns on an auxiliary valve Va2. The control unit 195 turns on the auxiliary valve Va2 to form a current path connecting the auxiliary valve Va2, an inductor L2, and a capacitor Cs to each other. Thus, the control unit 195 applies the voltage generated by the voltage generation unit 170. The voltage applied into the capacitor Cs has the same polarity as that of voltage generation unit 170. Thus, the control unit 195 charges one end of the capacitor Cs connected to auxiliary valves Va3 and Va4 so that the one end of the capacitor Ca has positive (+) polarity and charges the other end of the capacitor Cs that is grounded so that the other end of the capacitor Cs has negative (−) polarity.

In operation S309, the control unit 195 turns off the auxiliary valve Va2 and turns on the auxiliary valve Va3 and a charging auxiliary valve Vaux. The control unit 195 turns off the auxiliary valve Va2 and turns on the auxiliary valve Va3 and the charging auxiliary valve Vaux to form a current path connecting the capacitor Cs, the auxiliary valve Va3, the inductor L1, and the charging auxiliary valve Vaux to each other. The current may be resonant along the current path connecting the capacitor Cs, the auxiliary valve Va3, the inductor L1, and the charging auxiliary valve Vaux to each other. As the current is resonant, the voltage charged in the capacitor Cs is applied into the charging auxiliary valve Vaux. Since the charging auxiliary valve Vaux and the test valve Vt are in parallel relationship, the voltage applied into the charging auxiliary valve Vaux may charge a gate driver of the test valve Vt. As the current is resonant, the capacitor Cs may be changed in polarity. That is, the capacitor Cs may be changed in polarity so that the one end of the capacitor Cs has the negative polarity, and the other end of the capacitor Cs has the positive polarity.

In operation S311, the control unit 195 turns off the auxiliary valve Va3 and the charging auxiliary valve Vaux and turns on the auxiliary valve Va4. The control unit 195 turns off the auxiliary valve Va3 and charging auxiliary valve Vaux and turns on the auxiliary valve Va4 to form a current path connecting the capacitor Cs, the capacitor Ct, and the inductor L1 and the auxiliary valve Va4 to each other. The current may be resonant by passing through the current path the auxiliary valve Va5, the capacitor Cs, and the inductor L1. Thus, the capacitor Cs may be changed in polarity. That is, the capacitor Cs may be changed in polarity so that the one end of the capacitor Cs has the positive polarity, and the other end of the capacitor Cs has the negative polarity. In the embodiment of FIGS. 2 and 3, when the capacitor Cs is discharged to charge the gate driver of the test valve Vt, the capacitor Ct may be changed to turn on the auxiliary valve Va4. However, in the embodiment of FIGS. 5 and 6, even though the capacitor Cs is discharged to charge the gate driver of the test valve Vt, since the current flows into the charging auxiliary valve Vaux to prevent the capacitor Ct from being charged, the auxiliary valve Va4 may be turned on.

In operation S313, the control unit 195 turns off the auxiliary valve Va4 and turns on an auxiliary valve Va5. The control unit 195 forms a current path connecting the auxiliary valve Va5, the inductor L2, and the capacitor Cs to each other. The current may be resonant by passing through the auxiliary valve Va5, the inductor L2, and the capacitor Cs. Thus, the capacitor Cs may be changed in polarity. That is, the capacitor Cs may be changed in polarity so that the one end of the capacitor Cs has the positive polarity, and the other end of the capacitor Cs has the negative polarity. The control unit 195 repeatedly performs the process in which the auxiliary valve Va2 is turned on if the gate driver of the test valve Vt is not fully charged. Thus, the gate driver of the test valve Vt may be fully charged.

The control unit 195 tests the test valve Vt through following operations.

In operation S315, the control unit 195 turns off the auxiliary valve Va5 and turns on the auxiliary valve Va2. The control unit 195 turns off the auxiliary valve Va5 and turns on the auxiliary valve Va2.

In operation S317, the control unit 195 turns off the auxiliary valve Va2 and turns on the test valve Vt. The control unit 195 turns off the auxiliary valve Va2 and turns on the test valve Vt to form a current path connecting the test valve Vt and the capacitor Cs to each other. Here, since the gate driver of the test valve Vt is charged through the above-described processes, the control unit 195 may turn on the test valve Vt.

In operation S319, the control unit 195 turns on an auxiliary valve Va1. The control unit 195 turns on the auxiliary valve Va1 to apply the DC current generated by the current generation unit 130 into the test valve Vt. Thus, the control 195 tests whether the test valve Vt normally operates when the DC current that is above the reference current valve is applied to the test valve Vt.

In operation S321, the control unit 195 turns off the auxiliary valve Va1 and turns on the auxiliary valve Va3. The control unit 195 turns off the auxiliary valve Va1 and turns on the auxiliary valve Va3 to form a current path connecting the capacitor Cs, the auxiliary valve Va3, the inductor L1, and the test valve Vt to each other. The control unit 195 applies the voltage charged in the capacitor Cs into the test valve Vt. That is, the control unit 195 applies a positive voltage to one end of the test valve Vt connected to one end of the inductor L1 and a negative voltage to the other end of the test valve Vt. Hereinafter, when the one end of the test valve Vt has the positive polarity, and the other end of the test valve Vt has the negative polarity, the applied voltage may be referred to as a forward voltage. On the other hand, when the one end of the test valve Vt has the negative polarity, and the other end of the test valve Vt has the positive polarity, the applied voltage may be referred to as a reverse voltage. The current may resonant along the current path connecting the capacitor Cs, the auxiliary valve Va3, the inductor L1, and the test valve Vt to each other. Thus, the control 195 tests whether the test valve Vt normally operates when the forward voltage is applied to the test valve Vt. As the current is resonant along the current path connecting the capacitor Cs, the auxiliary valve Va3, the inductor L1, and the test valve Vt to each other, the capacitor Cs may be changed in polarity. That is, the capacitor Cs may be changed in polarity so that the one end of the capacitor Cs has the negative polarity, and the other end of the capacitor Cs has the positive polarity.

In operation S323, the control unit 195 turns off the test valve Vt and the auxiliary valve Va3 and turns on the auxiliary valve Va4. The control unit 195 turns off the test valve Vt and the auxiliary valve Va3 and turns on the auxiliary valve Va4 to apply the voltage charged in the capacitor Cs into the test valve Vt. That is, the control unit 195 applies the reverse voltage into the test valve Vt. Thus, the control 195 tests whether the test valve Vt normally operates when the reverse voltage is applied to the test valve Vt.

In operation S325, the control unit 195 turns off the auxiliary valve Va4 and turns on an auxiliary valve Va5. The control unit 195 turns off the auxiliary valve Va4 and turns on the auxiliary valve Va5 to form a current path connecting the capacitor Cs, the auxiliary valve Va5, and the inductor L2 to each other. The current may be resonant along the current path connecting the capacitor Cs, the auxiliary valve Va5, and the inductor L2 to each other. Thus, the capacitor Cs may be changed in polarity. That is, the capacitor Cs may be changed in polarity so that the one end of the capacitor Cs has the positive polarity, and the other end of the capacitor Cs has the negative polarity.

In operation S327, the control unit 195 turns off the auxiliary valve Va5 and turns on the auxiliary valve Va2. Since resistant components exist in abnormal actual devices, the voltage applied into the capacitor Cs may be reduced into its initial state as a time elapses. The control unit 195 turns on the auxiliary valve Va2 to charge the voltage generated by the voltage generation unit 170 to the capacitor Cs.

In operation S329, the control unit 195 turns on the auxiliary valve Va2. In the operation S329, when the capacitor Cs is fully charged, the control unit 195 turns off the auxiliary valve Va2 to stop the charging of the capacitor Cs. When the capacitor Cs is fully charged, the process returns to the operation S305, in which the auxiliary valve Va1 and the test valve Vt are turned on, and then the control unit 195 may perform again the synthetic test with respect to the test valve Vt.

The synthetic test circuit that creates the operation environment similar to that of the actual HVDC valve to test the HVDC valve may be provided to improve reliability in synthetic test.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A synthetic test circuit for synthetic-testing a thyristor valve in high voltage direct current (HVDC), the synthetic test circuit comprising:
   a resonant circuit comprising the thyristor valve, a first auxiliary valve connected in series to the thyristor valve, and a charging auxiliary valve connected in parallel to the thyristor valve and applying forward DC current, a reverse DC voltage, and a forward DC voltage to the thyristor valve;
   a current generation unit connected to the charging auxiliary valve of the resonant circuit and generating DC current that is above a reference current value to supply the generated DC current to the resonant circuit; and
   a voltage generation unit connected to the charging auxiliary valve of the resonant circuit and generating a DC voltage that is above a reference voltage value to supply the generated DC voltage to the resonant circuit, the DC voltage becoming the forward DC voltage or the reverse DC voltage according to a polarity of the thyristor valve,
   wherein the charging auxiliary valve is used for charging a gate driver of the thyristor valve.

2. The synthetic test circuit according to claim 1, wherein the resonant circuit further comprises:
   a second auxiliary valve connected to the voltage generation unit;
   a first inductor connected to the second auxiliary valve; and
   a first capacitor connected to the first inductor,
   wherein the resonant circuit further comprises a control unit that turns on the second auxiliary valve to form a current path connecting the second auxiliary valve, the first inductor and the first capacitor, thereby charging the DC voltage from the voltage generation unit into the first capacitor.

3. The synthetic test circuit according to claim 2, wherein the resonant circuit further comprises a third auxiliary valve connected to the first capacitor; and
   a second inductor connecting the second auxiliary value to the charging auxiliary valve, and
   wherein the control unit turns off the second auxiliary valve and turns on the third auxiliary valve and the charging auxiliary valve to form a current path connecting the first capacitor, the third auxiliary valve, the second inductor and the charging auxiliary valve, thereby applying the DC voltage from the first capacitor to the charging auxiliary valve and charging the gate driver of the thyristor valve.

4. The synthetic test circuit according to claim 3, wherein the resonant circuit further comprises a fourth auxiliary valve connected in parallel to the third auxiliary valve; and
   a second capacitor connected to the second inductor and the charging auxiliary valve and simulating parasitic capacitance of the thyristor valve,
   a forward direction of the voltage applied into the third auxiliary valve is opposite to that of the voltage applied into the fourth auxiliary valve, and
   wherein the control unit turns off the third auxiliary valve and the charging auxiliary valve and turns on the fourth auxiliary valve to form a current path connecting the first capacitor, the second capacitor, the second inductor and the fourth auxiliary valve, thereby charging the DC voltage from the first capacitor into the second capacitor.

5. The synthetic test circuit according to claim 4, wherein the resonant circuit comprises:
   a fifth auxiliary valve connected to the second auxiliary valve and the first inductor,
   wherein the control unit turns off the fourth auxiliary valve and turns on the fifth auxiliary valve to form a current path connecting the fifth auxiliary valve, the first inductor and the first capacitor.

6. A synthetic test circuit for synthetic-testing a thyristor valve in high voltage direct current (HVDC), the synthetic test circuit comprising:
   a current generation unit;
   a first auxiliary valve connected to the current generation unit;
   the thyristor valve connected in series to the first auxiliary valve and another end that is grounded;
   a charging auxiliary valve connected in parallel to the thyristor valve;
   a second capacitor connected to the charging auxiliary valve;
   a second inductor connected to the charging auxiliary valve and the second capacitor;
   a third auxiliary valve connected to the second inductor;
   a fourth auxiliary valve connected in parallel to the third auxiliary valve and connected to the second inductor;
   a first capacitor connected to the third and fourth auxiliary valves;
   a first inductor connected to the first capacitor and the third and fourth auxiliary valves;
   a fifth auxiliary valve connected to the first inductor;
   a second auxiliary valve connected to the fifth auxiliary valve and the first inductor; and
   a voltage generation unit connected to the second auxiliary valve,
   wherein the charging auxiliary valve is used for charging a gate driver of the thyristor valve.

7. The synthetic test circuit according to claim 6, wherein the current generation unit comprises an inverter having a six-pulse bridge shape, and
   the fifth auxiliary valve is connected to one end of the inverter.

8. The synthetic test circuit according to claim 7, wherein the current generation unit comprises:
   a rectification part having a six-pulse bridge shape, rectification part being back-to-back connected to the inverter; and
   a smoothing part connected to the inverter and connected to the rectification part.

* * * * *